Figure 1:
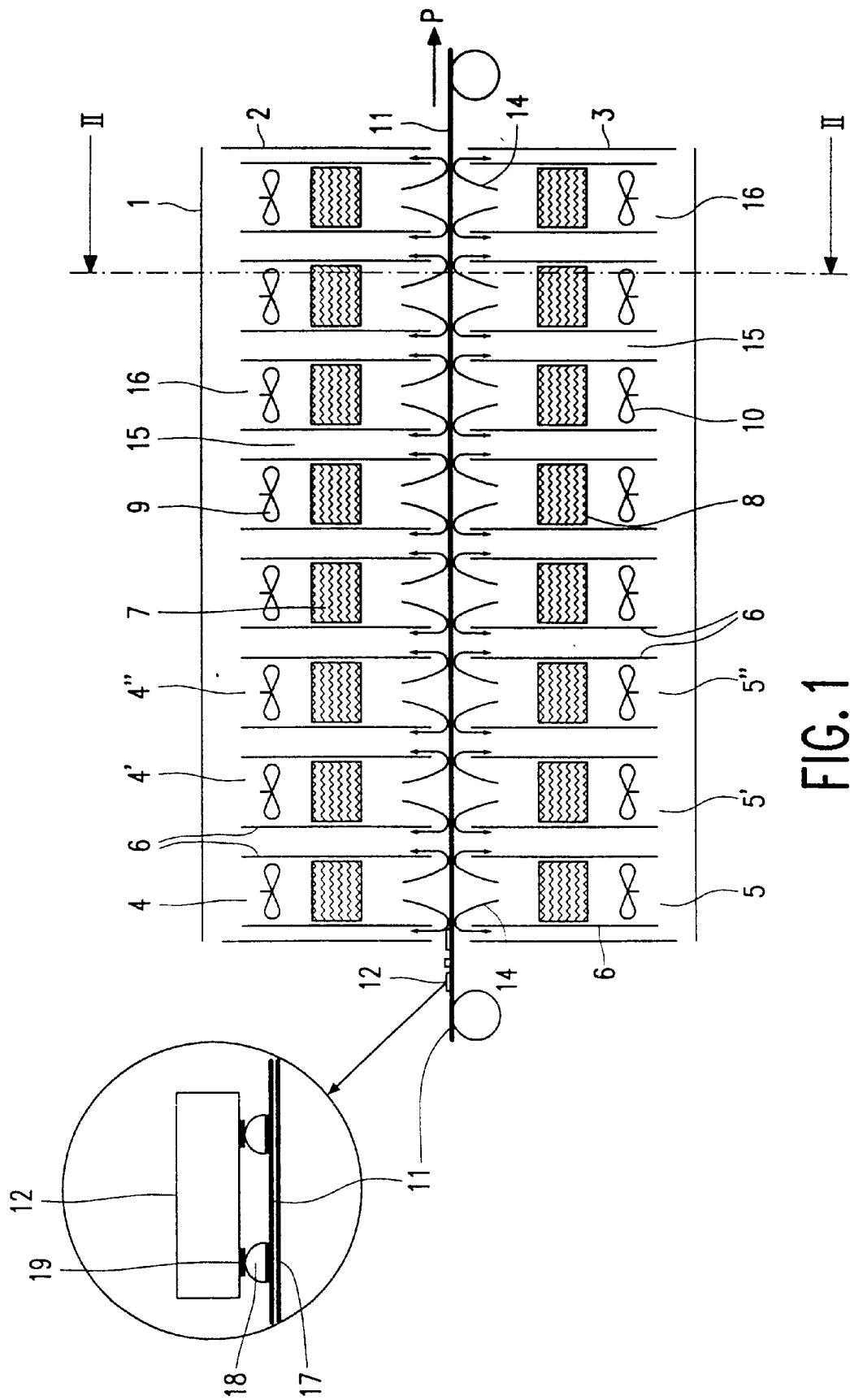

United States Patent [19]
Wesseling et al.

[11] Patent Number: 6,005,224
[45] Date of Patent: Dec. 21, 1999

[54] METHOD OF SOLDERING COMPONENTS TO AT LEAST ONE CARRIER

[75] Inventors: Wessel J. Wesseling; Otto Nienhuis, both of Eindhoven, Netherlands

[73] Assignee: U.S. Philips Corporation, New York, N.Y.

[21] Appl. No.: 09/102,478

[22] Filed: Jun. 22, 1998

[30] Foreign Application Priority Data

Oct. 30, 1997 [EP] European Pat. Off. ............. 97203362

[51] Int. Cl.$^6$ ............................. B23K 1/012; B23K 31/02
[52] U.S. Cl. .................. 219/388; 219/400; 228/180.21; 228/234.1
[58] Field of Search ................................... 219/388, 400; 228/102, 179.1–180.22, 234.1; 432/152; 34/216, 224, 225, 233, 492, 493, 495, 496, 545, 554, 570, 579

[56] References Cited

U.S. PATENT DOCUMENTS

| | | | |
|---|---|---|---|
| 5,180,096 | 1/1993 | Kondo | 228/180.1 |
| 5,259,546 | 11/1993 | Volk | 228/102 |
| 5,338,008 | 8/1994 | Okuno et al. | 432/152 |
| 5,345,061 | 9/1994 | Chanasyk et al. | 219/388 |
| 5,440,101 | 8/1995 | Cox et al. | 219/388 |
| 5,573,688 | 11/1996 | Chanasyk et al. | 219/388 |
| 5,683,242 | 11/1997 | Cronin et al. | 432/152 |

FOREIGN PATENT DOCUMENTS

| | | |
|---|---|---|
| 469788 | 2/1992 | European Pat. Off. . |
| 0658081A1 | 6/1995 | European Pat. Off. . |
| 658081 | 6/1995 | European Pat. Off. . |
| 0469788B1 | 11/1996 | European Pat. Off. ....... H05K 13/04 |
| 6-45745 | 2/1994 | Japan . |
| 6-224551 | 8/1994 | Japan . |
| 9-219582 | 8/1997 | Japan . |

*Primary Examiner*—Joseph Pelham
*Attorney, Agent, or Firm*—Anne E. Barschall

[57] ABSTRACT

The invention relates to a method of connecting components (12) to at least one carrier (11), for example by soldering or gluing. Such a method is carried out in an oven (1) through which carriers are moved. Preferably, the carrier is a flexible foil. The carrier separates the oven into an upper part (2) and a lower part (3). In both parts a hot air stream (14) is created and directed toward the carrier. Owing to the separation by the foil the hot air stream in the upper part cannot reach the lower part and vice versa. The temperature of the hot air stream in the upper part differs from that (is, for example, higher than) in the lower part. The heating elements in the upper part of the oven may all have the same high temperature (for example, 240° C.) and the heating elements in the lower part may all have the same low temperature (for example, 60° C.). By adjusting at least one air stream the desired temperature at the location of the carriers (for example, at solder lands 17) can be obtained very rapidly (comparable with a hot/cold water mixing tap).

14 Claims, 2 Drawing Sheets

METHOD OF SOLDERING COMPONENTS TO AT LEAST ONE CARRIER

The invention relates to a method of connecting components to at least one carrier provided with connection points, comprising the application of a connection medium at the connection points, the placement of the components onto the carrier, the transport of the carrier with the components through an oven, in which oven a hot air stream is led to both sides of the carrier, which hot air streams are controllable and are separated from one another at the level of the carrier, the temperature of the air stream at one side of the carrier being higher than at the other side of the carrier and the connection points being situated at the side of the air stream having the higher temperature.

Such a method of soldering components is known from EP-B1-0 469 788.

The method described above is used, for example, for soldering components to a carrier, referred to as "reflow" soldering. By means of a component placement machine the components are positioned on a carrier in such a manner that the electrical contacts of the component are located at the corresponding solder points (solder lands) of the carrier. Before the components are placed the solder lands are provided with a solder, usually a solder paste. In a reflow oven the solder is melted and subsequently cooled in order to connect the electrical contacts electrically and mechanically to the solder lands. In this process (the carrier) is passed through the oven in a continuous fashion, i.e. with a uniform speed. The oven generally has different sections which are heated separately in order to achieve a gradual heating to the melting temperature. Before the soldering process begins the various sections in the oven are heated to the desired temperatures. At either side of the carrier or carriers each section usually has a heating element with an associated fan for producing a hot air stream which is directed toward the carrier. The two hot air streams in a section are mixed, as a result of which a given temperature is established at the location of the carrier. By adjusting the temperature of the heating elements the desired temperature in the section is reached after some time. This is also necessary for the other sections. This adjustment takes a comparatively long time, for example half an hour or more. When another carrier is to be soldered, for example a larger or smaller carrier, the temperature of the oven should be readjusted.

The afore-mentioned EP-B1-0 469 788 describes a reflow soldering process in which a separation is provided between the hot air streams in a section of the oven. This separation is obtained by means of the carriers themselves and by additional shielding plates. Consequently, no mixing occurs between the two air streams. The temperature of the air stream at one side of the carrier is substantially lower than at the other side, as a result of which at one side of the carrier, at the level of the carrier, a temperature prevails which is lower than at the other side. The solder to be melted is situated at the high-temperature side. The process concerns in particular the soldering of leaded components, which components should not be exposed to the high soldering temperature. In this known soldering process said component is situated at the comparatively low temperature side of the carrier and the contact leads to be soldered project through the carrier and are soldered to the solder lands at other, high-temperature, side of the carrier. Here, the separation between the air streams has been provided only in order to achieve that during soldering the component is in an environment at a comparatively low temperature so as to protect the component from overheating.

When the components are mounted on a carrier by means of an adhesive the curing process generally also takes place in such a oven. However, the temperature setting is then different, usually lower.

It is an object of the invention to improve the component soldering method of the type defined in the opening paragraph in such a manner that a very rapid adjustment of the desired oven temperature is achieved.

To this end, the invention is characterized in that the temperature at the connection points can be adjusted to a desired value by controlling the flow rate of at least one of the hot air streams.

Such a control is best compared with the control of the mixture of hot and cold water in a mixing faucet. Slightly more cold water immediately yields a lower temperature. This functions in a similar way for the hot air streams of different temperatures in the oven. Preferably, the temperature is adjusted to the desired value by controlling the flow rates of the two air streams.

Since this method thus allows a rapid temperature adjustment, the hot air streams during the connection process are preferably continuously controllable in order to obtain a desired temperature at the connection points. Viewed in the direction of transport of the carrier through the oven there is a given desired temperature profile in the oven. In the case of a minor deviation this profile can be corrected rapidly. Preferably, in the case of a disruption in the transport of the carrier the temperature profile is shifted in a direction opposite to the transport direction of the carrier by controlling the air streams. A great advantage of this is that if during the connection process, for example a soldering process, the transport of the carrier or carriers slows down for any reason whatsoever, the soldering process can proceed normally because a rapid correction of the temperature in various sections of the oven is now possible. In fact, the temperature profile can be maintained in the case of a fault. In effect, a running temperature profile is obtained, which corresponds to the temperature profile in the situation where the transport of carriers through the oven proceeds normally. A solution to the problem of a disruption in the transport of a carrier through an oven is described in EP-A1-0 658 081. The carrier in said Application is a foil. The oven is mobile. As soon as a disruption occurs, the oven is moved in a direction opposite to the direction of transport of the foil. In such an arrangement the oven requires a comparatively large area in view of its mobility. The oven in accordance with the invention can normally remain stationary and consequently requires a smaller area.

Furthermore, the carrier is preferably a long flexible foil, which is moved continuously through the oven. The temperature difference within the foil is small because the thickness of the foil is very small (approximately 50 $\mu$m). Moreover, as a consequence of this, the heat content of the foil is small, as a result of which the influence of the temperature of the foil itself on the temperature at the connection points is negligible.

The invention also relates to an oven for connecting components to at least one carrier at connection points, which carrier(s) is (are) moved through the oven during operation, the carrier(s) separating the oven into two parts, each part having means for generating a hot air stream which is led to the carrier(s), which hot air streams are separated from one another by the carriers and have different temperatures, which oven further comprises means by which a desired temperature at the connection points is controllable when during operation a temperature difference greater than a given limit value occurs between the value of the desired temperature and of the prevailing temperature by controlling the flow rate of at least one of the air streams.

Figure 2:
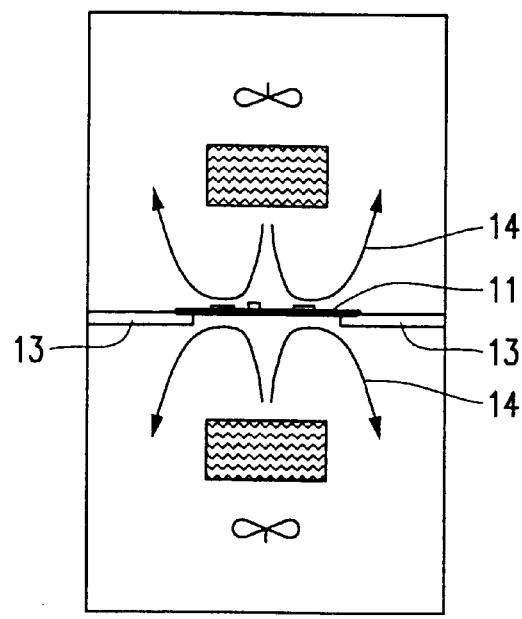
Figure 3:
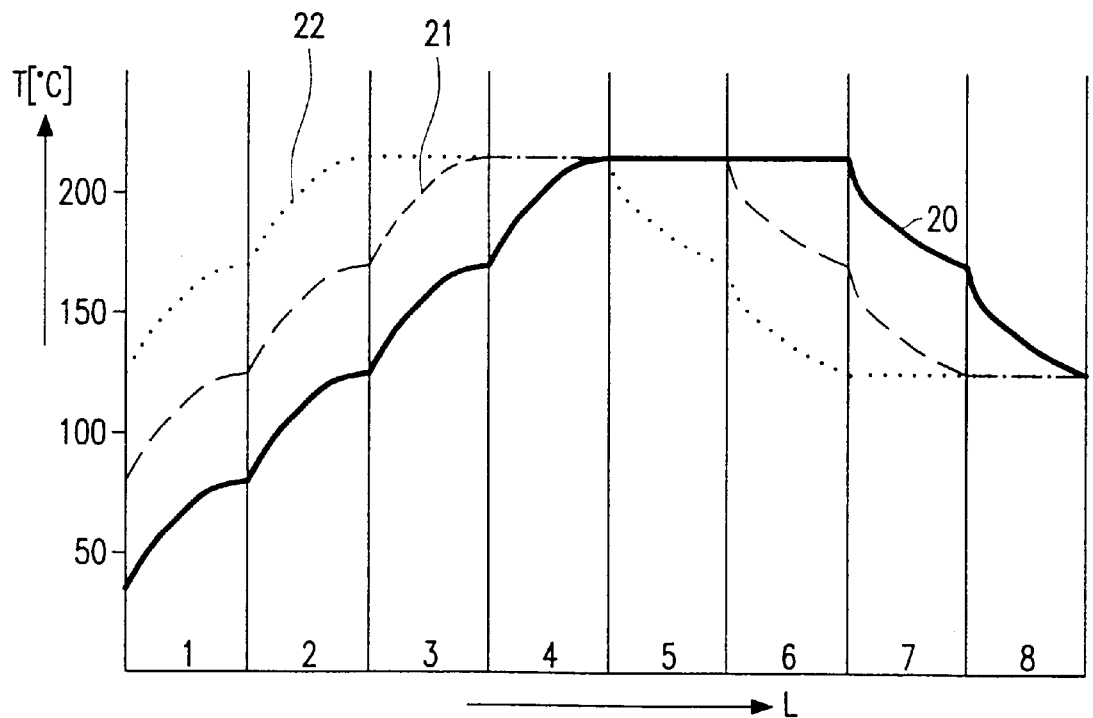

The invention will now be described in more detail with reference to an example shown in the drawings. In the drawings FIG. 1 is a diagrammatic side view of an oven in which the method is used, FIG. 2 is a diagrammatic cross-sectional view of the oven, taken on the line II—II in FIG. 1, and FIG. 3 is a temperature profile viewed in the longitudinal direction of the oven.

The oven has a housing 1 comprising an upper part 2 and a lower part 3.

Both the upper part and the lower part accommodate a plurality of heating sections 4, 4', 4"... and 5, 5', 5", which are separated from one another by shielding plates 6. Each heating section has a heating element 7, 8 and a fan 9, 10. A carrier in the form of a flexible foil 11 carrying components 12 is moved through the oven substantially in the center in the direction indicated by an arrow P. The oven is thus divided into said upper part 2 said lower part 3. The separation between the upper part and the lower part of the oven is provided by the foil 11 and by shielding plates and supporting plates 13 for the foil (see FIG. 2). In each section a hot air stream 14 is blown against the foil. At the foil the air stream is reversed and flows back to the inlet 16 of the fans 9, 10 through spaces 15 between the sections. In practice, the heating elements 7 in all the sections of the upper part 2 of the oven are kept at the same temperature. This also applies to the heating elements 8 of the sections in the lower part 3 of the oven. Before the foil is moved through the oven the foil is provided with a solder paste 18, for example by screen-printing or dispensing, at locations where the components are to be soldered, i.e. at the solder lands 17. Subsequently, the components 12 are placed onto the foil 12 by a component placement machine, so as to position the electrical contacts 19 of the components at the solder lands 17 with the solder paste 18. To adjust the temperature at the solder lands only the flow rates of the air streams in the individual sections are controlled. The temperature of a heating element 7 in a section in the upper part 2 of the oven is set to, for example, approximately 240° C. and that in the section in the lower part to, for example, 60° C. It is thus possible to obtain a temperature of, for example, 160° C. or 216° C. at the foil by controlling the two air streams. This temperature can be maintained by means of one or more sensors and a feedback control circuit known per se, which includes a flow rate control or/and a temperature control for the air streams. In such a manner, by controlling the air streams in the various sections in the oven, it is possible to obtain a certain temperature profile at the foil and, consequently, at the solder lands, as is indicated by a solid line 20 in FIG. 3. This line represents the temperature variation T in the longitudinal direction L of the oven. In the present example, the warming-up phase takes place in the first four sections. After the fourth section the melting temperature of the solder is reached, after which a cooling phase begins. If now the transport of the foil stops owing to a defect, the air streams in the various sections are controlled in such a manner the temperature profile for the components situated in the oven is maintained as though the transport of the foil proceeds normally. After a certain time, the temperature profile in the oven is shifted in a direction opposite to the transport direction P of the foil, as is indicated by a dashed line 21. After some more time, the temperature profile will be shifted even further, as is indicated by a dotted line 22. When the transport of the foil is resumed, the desired temperature profile can be restored very rapidly.

We claim:

1. A method of connecting components to at least one carrier provided with connection points, comprising
   a. applying a connection medium at the connection points,
   b. placing the components onto the carrier,
   c. transporting the carrier with the components through an oven,
   d. in the oven, leading a respective hot air stream to each side of the carrier,
   e. separating the respective hot air streams from each other using the carrier,
   f. controlling the respective hot air streams, so that the temperature of the respective hot air stream at one side of the carrier is higher than the temperature of the respective hot air stream at the other side of the carrier, the connection points being situated at the side of the carrier receiving the respective hot air stream having the higher temperature, and
   g. adjusting the temperature at the connection points a desired value by controlling the flow rate of at least one of the respective hot air streams.

2. A method as claimed in claim 1, characterized in that the air streams are continuously controllable during the connection process so as to obtain a desired temperature at the connection points.

3. A method as claimed in claim 2, in which a desired temperature profile exists, viewed in the transport direction of the carrier through the oven, during the process in the oven, characterized in that in the case of a disruption in the transport of the carrier the temperature profile is shifted in a direction opposite to the transport direction of the carrier by controlling the air streams.

4. A method as claimed in claim 3, characterized in that the carrier is a long, flexible foil, which is moved continuously through the oven.

5. A method as claimed in claim 1, characterized in that the temperature of the air stream at the upper side of the carrier is higher than at the underside of the carrier.

6. An oven for connecting components to at least one carrier at connection points, which carrier(s) is (are) moved through the oven during operation, comprising
   a. first and second parts, separated by the carrier(s), each part having means for generating a respective hot air stream and for leading the respective hot air stream to the carrier(s), which respective hot air streams are separated from one another by the carrier(s) and have different temperatures, and
   b. means for controlling a desired temperature at the connection points, during operation, when a temperature difference greater than a given limit value occurs between the value of the desired temperature and of the prevailing temperature, by controlling the flow rate of at least one of the respective hot air streams.

7. The method of claim 1, wherein the leading step comprises leading first and second pluralities of hot air streams to first and second sides of the carrier, respectively, each hot air stream heating a respective distinct section of the respective side of the carrier.

8. The method of claim 1, wherein side of the carrier which does not have the higher temperature has a temperature of less than 100° C., and the carrier itself has a temperature intermediate between the respective hot air streams.

9. The oven of claim 6, wherein the respective hot air streams are continuously controllable during the connection process so as to obtain a desired temperature at the connection points.

10. The oven of claim 6,
   a. wherein a desired temperature profile exists, viewed in the transport direction of the carrier through the oven, during the process in the oven; and
   b. further comprising means for, in case of a disruption in the transport of the carrier, shifting the temperature profile in a direction opposite to the transport direction of the carrier by controlling the air streams.

11. The oven of claim 10, wherein the carrier is a long, flexible foil, which is moved continuously through the oven.

12. The oven of claim 6, wherein the temperature of the respective hot air stream at the upper side of the carrier is higher than at the underside of the carrier.

13. The oven of claim 6, wherein the means for generating comprises first and second pluralities of heating sections, situated, respectively, on first and second sides of the carrier (s), each heating section leading a distinct hot air stream to a distinct section of the respective side of the carrier.

14. The oven of claim 6, wherein at least one side of the carrier has a temperature less than 100° C.

* * * * *